(12) United States Patent
Chang

(10) Patent No.: US 7,403,388 B2
(45) Date of Patent: Jul. 22, 2008

(54) COOLING SYSTEM FOR SERVER AND SERVER HAVING THE SAME

(75) Inventor: Yao-Ting Chang, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 49 days.

(21) Appl. No.: 11/309,111

(22) Filed: Jun. 23, 2006

(65) Prior Publication Data
US 2007/0097634 A1 May 3, 2007

(30) Foreign Application Priority Data
Nov. 1, 2005 (CN) .................... 2005 1 0100976

(51) Int. Cl.
*H05K 7/20* (2006.01)
(52) U.S. Cl. ........................ 361/695; 361/694
(58) Field of Classification Search ............... None
See application file for complete search history.

(56) References Cited

U.S. PATENT DOCUMENTS

| | | | |
|---|---|---|---|
| 5,734,551 A * | 3/1998 | Hileman et al. ............ 361/695 |
| 6,130,819 A * | 10/2000 | Lofland et al. ............ 361/695 |
| 6,292,361 B1 * | 9/2001 | Johnson et al. ............ 361/687 |
| 6,330,154 B1 * | 12/2001 | Fryers et al. ............ 361/695 |
| 6,442,024 B1 * | 8/2002 | Shih ............ 361/695 |
| 6,504,718 B2 * | 1/2003 | Wu ............ 361/695 |
| 7,061,760 B2 * | 6/2006 | Hornung et al. ............ 361/695 |
| 7,061,761 B2 * | 6/2006 | Tucker et al. ............ 361/695 |
| 7,215,543 B2 * | 5/2007 | Arbogast et al. ............ 361/695 |

FOREIGN PATENT DOCUMENTS

| CN | 1414442 A | 4/2003 |
|---|---|---|
| CN | 2653580 Y | 11/2004 |
| CN | 1852645 A | 10/2006 |

* cited by examiner

*Primary Examiner*—Gregory D Thompson
(74) *Attorney, Agent, or Firm*—Wei Te Chung

(57) ABSTRACT

A cooling system in accordance with a preferred embodiment of the invention includes a chassis, a fan mounted in the chassis, a memory, and an air conducting cover, wherein the air conducting cover comprises two sidewalls mounted in the chassis, and a top wall connecting tops of the two sidewalls, the two sidewalls and the top wall cooperatively form an airflow channel, and the memory is in the airflow channel. Because the airflow channel is narrow, a more efficient airflow speed is achieved in the airflow channel. Thus, the cooling system effectively dissipates heat without encroaching on much needed space.

10 Claims, 5 Drawing Sheets

COOLING SYSTEM FOR SERVER AND SERVER HAVING THE SAME

DESCRIPTION

1. Field of the Invention

The present invention relates to a cooling system and a server, and particularly to a cooling system that can improve heat dissipation efficiency for a server and a server having the same.

2. Description of Related Art

In a server, there are many components which generate heat when the server operates. If the components become to hot the server may not operate normally. Therefore, in designing a server, cooling systems are employed to dissipate the heat generated by the components.

In a typical design, special cooling systems for data storage devices of a server are not usually employed because previously typical data storage devices did not produce much heat. However, with improvements in electronic technology, improved data storage devices have appeared that have a drawback of producing more heat. For example, a high-speed fully-buffered DIMM (FB-DIMM), produces a great deal more heat than previous memory devices and can easily overheat if a cooling system of a server employing the FB-DIMM does not effectually dissipate the heat generated by the BF-DIMM.

What is needed, therefore, is a cooling system specially for a memory of a server that can effectually dissipate heat generated by the memory.

SUMMARY OF THE INVENTION

A cooling system in accordance with a preferred embodiment of the invention includes a chassis, a fan mounted in the chassis, a memory, and an air conducting cover, wherein the air conducting cover comprises two sidewalls mounted in the chassis, and a top wall connecting tops of the two sidewalls, the two sidewalls and the top wall cooperatively form an airflow channel, and the memory is in the airflow channel.

Other advantages and novel features will become more apparent from the following detailed description when taken in conjunction with the accompanying drawings, in which:

DETAILED DESCRIPTION OF THE INVENTION

Figure 1:
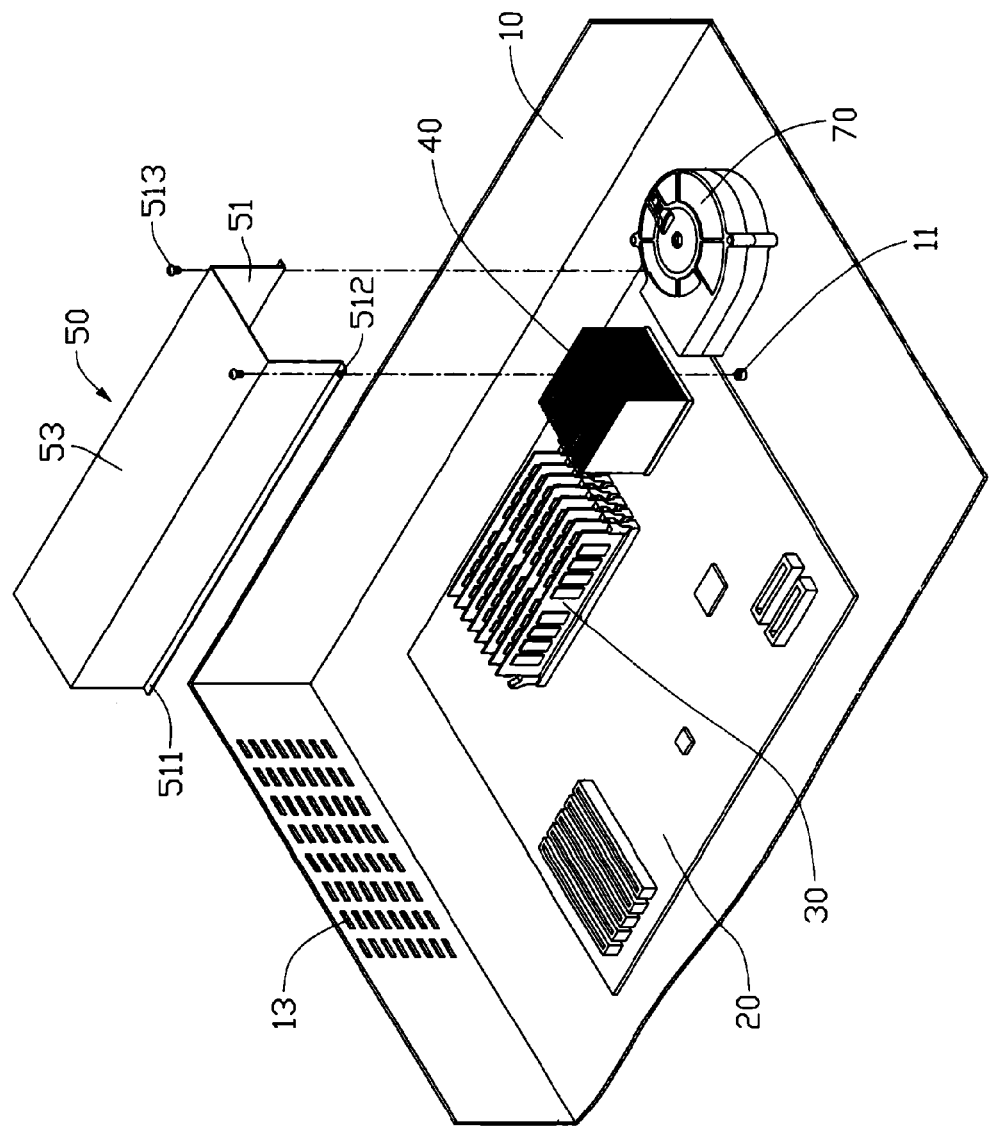
FIG. 1 is an isometric view of a cooling system in accordance with a preferred embodiment of the present invention, and a server.
Figure 2:
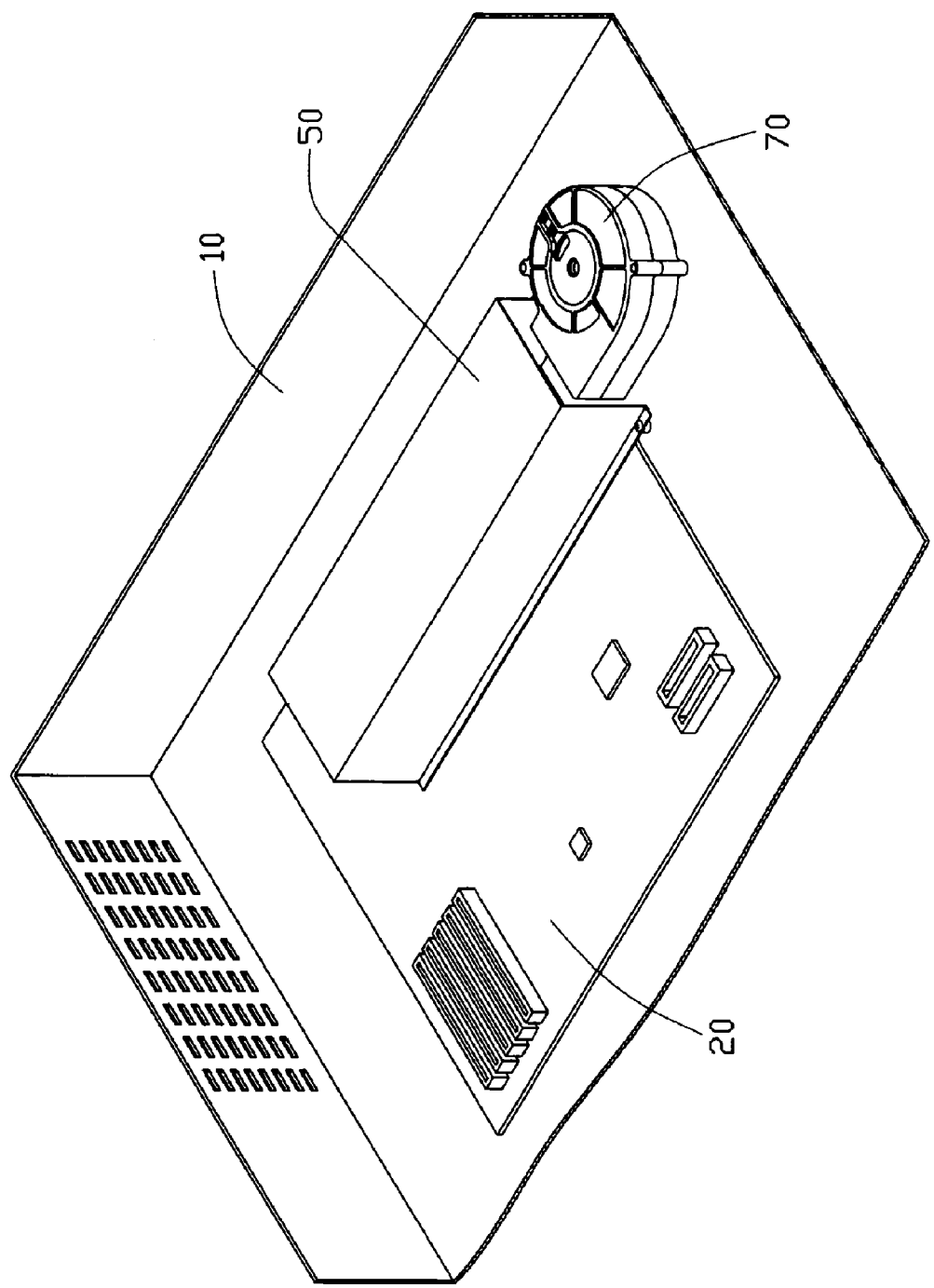
FIG. 2 is an assembled view of FIG. 1.

Referring to FIG. 1 and FIG. 2, a cooling system for a server, in accordance with the first preferred embodiment of the present invention is shown. The cooling system includes a chassis 10, a memory 30, a heat sink 40 for a central processing unit (CPU), an air conducting cover 50, and a fan 70. The heat sink 40 is placed on the CPU. The air conducting cover 50 includes two sidewalls 51 and a top wall 53 connecting tops of the two sidewalls 51. Two flanges 511 respectively, perpendicularly extend out from bottoms of the two sidewalls 51. Two through holes 512 are respectively defined in ends of the two flanges 511. Two threaded holes 11 are defined in a wall of the chassis 10 respectively corresponding to the two through holes 512. A plurality of vents 13 to defined in another wall of the chassis 10 corresponding to the air conducting cover 50.

A motherboard 20 is mounted in the chassis 10. The memory 30 and the CPU are mounted adjacent each other on the motherboard 20. The memory 30 is an FB-DIMM. Two screws 513 are respectively inserted through the through holes 512 to be respectively engaged in the threaded holes 11 so that the memory 30 and the CPU 40 are defined in the air conducting cover 50.

Figure 3:
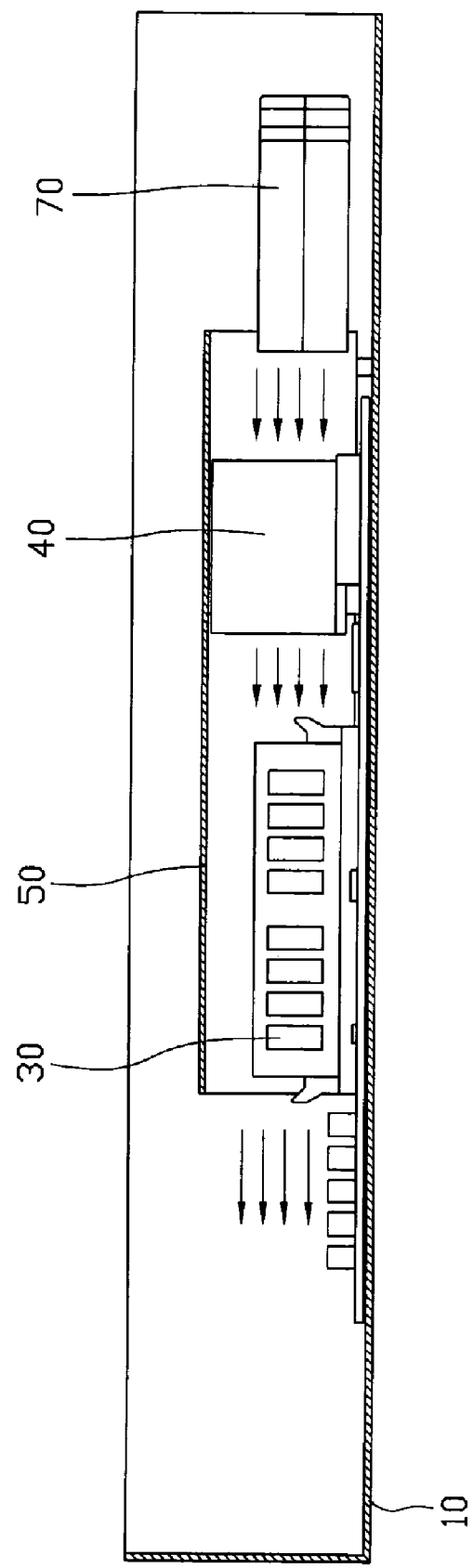
FIG. 3 is a part cross sectional view of FIG. 2.

Referring also to FIG. 3, in operation, the two sidewalls 51 and the top wall 53 cooperatively form an airflow channel. The fan 70 is mounted in the chassis 10, adjacent the heat sink 40. An airflow created by the fan 70 travels through the airflow channel and then out of the chassis 10 via the vents 13 so that the heat sink 40 and the memory 30 are cooled at the same time.

Figure 4:
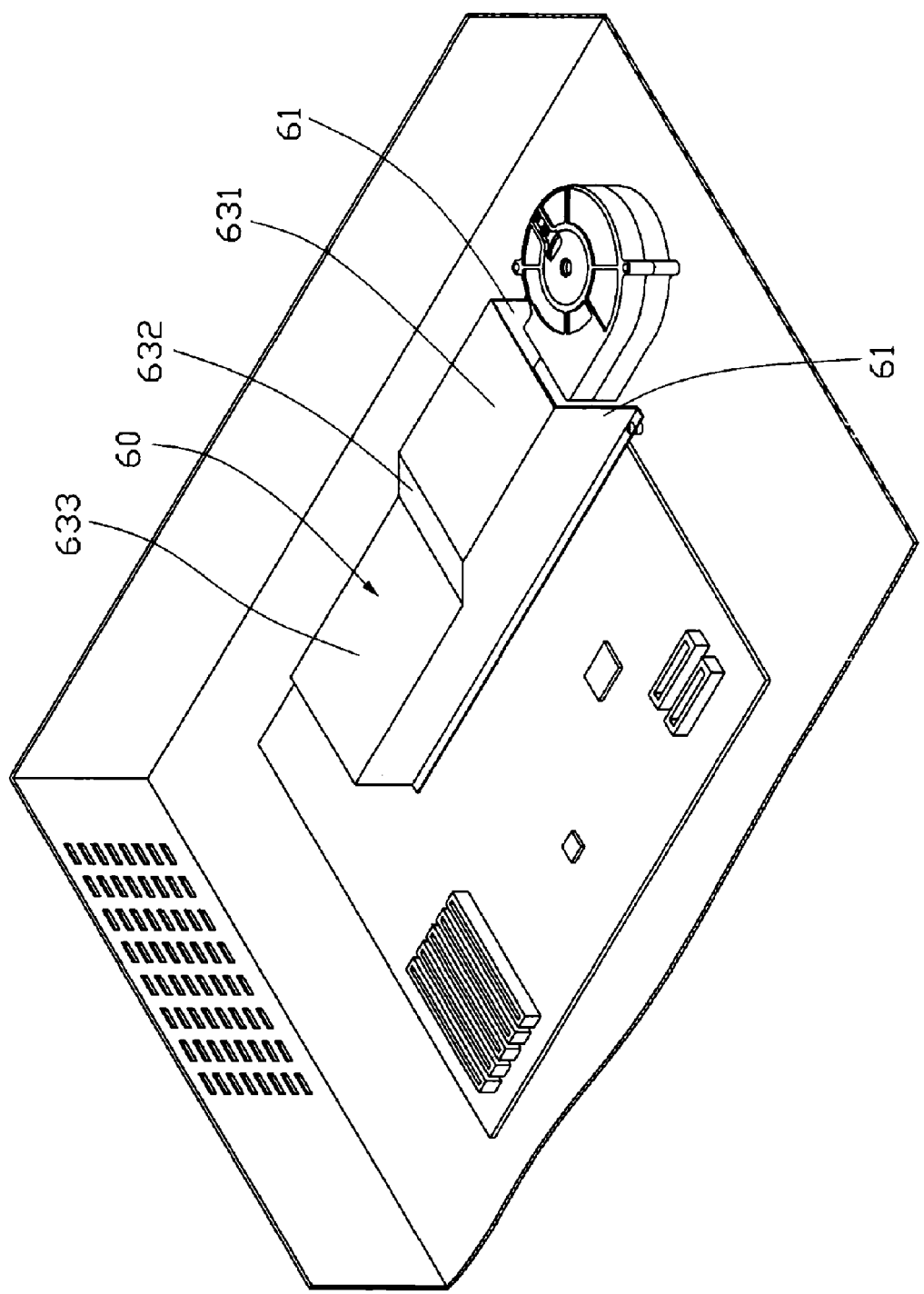
FIG. 4 is an isometric view of a cooling system in accordance with another preferred embodiment of the present invention, and a server.
Figure 5:
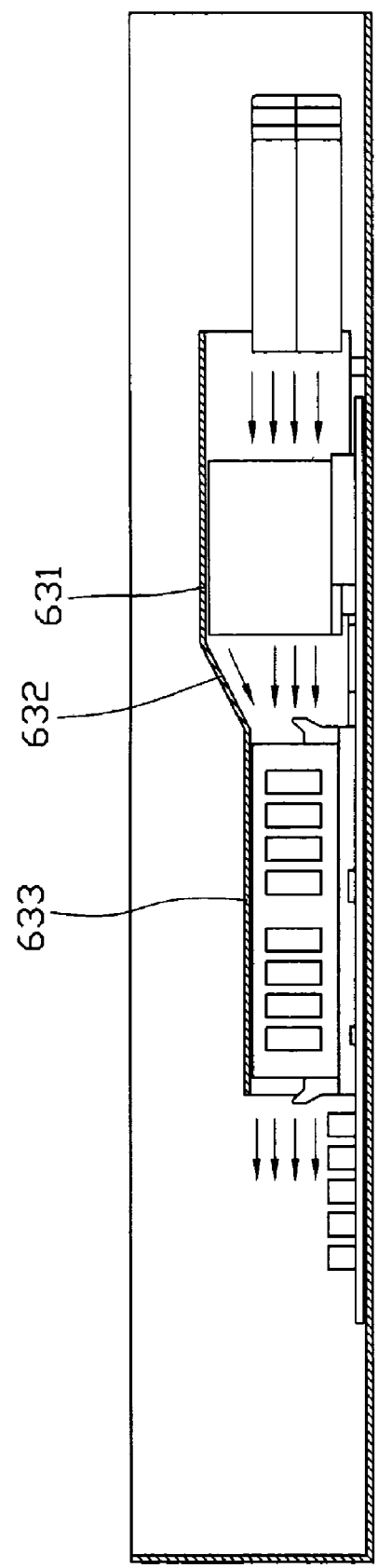
FIG. 5 is an assembled view of FIG. 4.

Referring to FIG. 4 and FIG. 5, a difference between the second preferred embodiment and the first preferred embodiment of the invention is that the second preferred embodiment includes an air conducting cover 60. A top wall of the air conducting cover 60 includes a first part 631, a slanting part 632, and a second part 633. The first part 631 and the second part 633 are offset. The slanting part 632 slants down from an edge of the first part 631. The second part 633 is connected to an end of the slanting part 632. The air conducting cover 60 forms an airflow channel, which gradually narrows from the first part 631 to the second part 633.

As known, the smaller a cross section of the airflow channel, the greater a speed of the airflow, and the greater the speed of the airflow, the greater a heat dissipation capability of the airflow. A correlation table of the airflow speed is given as follows:

|  | Without air conducting cover | With air conducting cover of the first embodiment | With air conducting cover of the second embodiment |
| --- | --- | --- | --- |
| Speed of the airflow around the Memory | 0.4~2.6 m/s | 2.0~2.4 m/s | 4.3~4.6 m/s |
| Difference of the maximum speed and the minimum speed | 2.2 m/s | 0.4 m/s | 0.3 m/s |
| Average speed | 1.28 m/s | 2.14 m/s | 4.47 m/s |
| Ratio of the average airflow speed of the invention and that of the related art | — | 67% | 249% |

In the preferred embodiments, because the airflow channel is narrow, a more efficient airflow speed is achieved in the airflow channel. Thus, the cooling system effectively dissipates heat without encroaching on much needed space.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A cooling system, comprising:
   a chassis comprising a plurality of vents defined in a wall thereof;
   a fan mounted in the chassis;
   a memory and a central processing unit (CPU) mounted in the chassis and arranged on a same straight line with the fan; and
   an air conducting cover, wherein the air conducting cover comprises two sidewalls mounted in the chassis, and a top wall connecting tops of the two sidewalls, the two sidewalls and the top wall cooperatively form an airflow channel, and the memory and the CPU are received in the airflow channel, the air flow channel comprises two opposite openings, with one of the openings aligning with the fan, and the other one of the openings aligning with the vents of the chassis, an airflow generated by the fan flows into the airflow channel and through the CPU and the memory in turn, then out of the chassis via the vents.

2. The cooling system as claimed in claim 1, wherein a heat sink is placed on the CPU in the airflow channel.

3. The cooling system as claimed in claim 1, wherein the chassis comprises a bottom plate, the top wall comprises a higher first part parallel with the bottom plate, a slanting part, and a lower second part parallel with the bottom plate and offset from the first part, the slanting part slants down from an edge of the first part to an end of the second part.

4. The cooling system as claimed in claim 1, wherein a flange extends out from a bottom of each of the two sidewalls, each flange defined a through hole in an end therefore, two threaded holes are defined in the chassis corresponding to the through holes of the sidewalls, two screws are respectively extended through the through holes and then engage in the corresponding threaded holes so that the memory is defined in the airflow channel.

5. A server, comprising:
   a chassis comprising a plurality of vents defined in a wall thereof;
   a motherboard mounted in the chassis;
   a memory mounted on the motherboard;
   a central processing unit (CPU) mounted on the motherboard;
   a fan mounted in the chassis adjacent the CPU and arranged on a same straight line with the memory and the CPU; and
   an air conducting cover mounted in the chassis covering the memory and the CPU, wherein the air conducting cover forms an airflow channel receiving the memory and the CPU, the airflow channel comprises two opposite openings, one of the openings aligns with the fan, and the other one of the openings aligns with the vents of the chassis, the airflow channel gradually narrows from an end adjacent the fan to the opposite end adjacent the vents.

6. The server as claimed in claim 5, wherein the air conducting cover comprises two sidewalls mounted in the chassis, and a top wall connecting tops of the two sidewalls, the two sidewalls and the top wall cooperatively form the airflow channel.

7. The server as claimed in claim 5, wherein an airflow generated by the fan flows into the airflow channel, and through the CPU and the memory in turn, then out of the chassis from the vents.

8. The server as claimed in claim 6, wherein the top wall comprises a first part, a slanting part, and a second part parallel offset from the first part, the slanting part slants down from an end of the first part to an end of the second part.

9. The server as claimed in claim 6, wherein a flange extends out from a bottom of each of the two sidewalls, each flange defines a through hole in an end thereof, two threaded holes are defined in the chassis corresponding to the through holes of the sidewalls, two screws are respectively extended through the through holes and then engage in the corresponding threaded holes so that the memory and the CPU are defined in the airflow channel.

10. The server as claimed in claim 5, further comprising a heat sink placed on the CPU.

* * * * *